US011441101B2

(12) United States Patent
Hirano et al.

(10) Patent No.: US 11,441,101 B2
(45) Date of Patent: Sep. 13, 2022

(54) CLEANING COMPOSITION, CLEANING METHOD, AND METHOD FOR MANUFACTURING SEMICONDUCTOR

(71) Applicants: TOKYO OHKA KOGYO CO., LTD., Kawasaki (JP); TOKYO ELECTRON LIMITED, Tokyo (JP)

(72) Inventors: Isao Hirano, Kawasaki (JP); Kazumasa Wakiya, Kawasaki (JP); Shoichi Terada, Kumamoto (JP); Junji Nakamura, Kumamoto (JP); Takayuki Toshima, Kumamoto (JP)

(73) Assignees: TOKYO OHKA KOGYO CO., LTD., Kawasaki (JP); TOKYO ELECTRON LIMITED, Tokyo (JP)

( * ) Notice: Subject to any disclaimer, the term of this patent is extended or adjusted under 35 U.S.C. 154(b) by 616 days.

(21) Appl. No.: 16/336,658

(22) PCT Filed: Sep. 22, 2017

(86) PCT No.: PCT/JP2017/034380
§ 371 (c)(1),
(2) Date: Mar. 26, 2019

(87) PCT Pub. No.: WO2018/062053
PCT Pub. Date: Apr. 5, 2018

(65) Prior Publication Data
US 2021/0284930 A1    Sep. 16, 2021

(30) Foreign Application Priority Data

Sep. 30, 2016    (JP) .............................. JP2016-195097

(51) Int. Cl.
C11D 3/37 (2006.01)
C11D 1/62 (2006.01)
C11D 1/12 (2006.01)
C11D 11/00 (2006.01)
G03F 7/039 (2006.01)
G03F 7/11 (2006.01)
G03F 7/42 (2006.01)

(52) U.S. Cl.
CPC .................. C11D 1/62 (2013.01); C11D 1/12 (2013.01); C11D 3/37 (2013.01); C11D 11/0047 (2013.01); G03F 7/0392 (2013.01); G03F 7/11 (2013.01); G03F 7/425 (2013.01); G03F 7/426 (2013.01)

(58) Field of Classification Search
CPC .............................. C11D 11/0047; C11D 3/37
USPC ........................................................... 510/175
See application file for complete search history.

(56) References Cited

U.S. PATENT DOCUMENTS

| 2007/0161248 | A1 | 7/2007 | Christenson et al. |
| 2012/0223054 | A1 | 9/2012 | Azuma et al. |
| 2012/0244690 | A1 | 9/2012 | Uozumi |
| 2014/0242520 | A1* | 8/2014 | Lee .................. G03F 7/0388 430/285.1 |
| 2015/0232792 | A1* | 8/2015 | Moore .................. C11D 3/044 510/176 |

FOREIGN PATENT DOCUMENTS

| JP | 2004-146594 A | 5/2004 |
| JP | 2010-157749 A | 7/2010 |
| JP | 4728402 B | 7/2011 |
| JP | 2012-069994 A | 4/2012 |
| JP | 4965673 B | 7/2012 |
| JP | 2012-186304 A | 9/2012 |
| JP | 2012-522264 A | 9/2012 |
| JP | 2012-203411 A | 10/2012 |
| TW | 200941159 A | 10/2009 |
| TW | 201239553 A | 10/2011 |
| TW | 201243936 A | 11/2012 |
| WO | WO 2009/096480 A1 | 8/2009 |
| WO | WO 2010/110848 A1 | 9/2010 |

OTHER PUBLICATIONS

Office Action issued in Taaiwanese Patent Application No. 106133044, dated Dec. 29, 2020.
Notification of Reasons for Refusal issued in Japanese Patent Application No. 2018-542525, dated Sep. 15, 2020.

\* cited by examiner

Primary Examiner — Gregory E Webb
(74) Attorney, Agent, or Firm — Knobbe, Martens, Olson & Bear LLP

(57) ABSTRACT

A cleaning composition which can remove a layer of interest using a conventional apparatus, such as a coater, a baking furnace and a cleaning chamber, installed in semiconductor manufacturing equipment while preventing the damage or deformation of layers other than the layer of interest, such as a substrate and an interlayer insulation film; a cleaning method using the cleaning composition; and a method for producing a semiconductor employing the cleaning method. A layer of interest formed on a substrate is cleaned with a cleaning composition containing a component capable of decomposing the layer of interest and a film-forming polymer. An example of the layer of interest is a hard mask film. An example of the component is at least one of a basic compound and an acidic compound.

13 Claims, No Drawings

CLEANING COMPOSITION, CLEANING METHOD, AND METHOD FOR MANUFACTURING SEMICONDUCTOR

This application is the U.S. National Phase under 35 U.S.C. § 371 of International Application PCT/JP2017/034380, filed Sep. 22, 2017, designating the U.S., and published in Japanese as WO 2018/062053 on Apr. 5, 2018 which claims priority to Japanese Patent Application No. 2016-195097, filed Sep. 30, 2016, the entire content of which is incorporated herein by reference.

TECHNICAL FIELD

The present invention relates to a cleaning composition, a cleaning method using said cleaning composition, and a method for manufacturing a semiconductor using said cleaning method.

BACKGROUND ART

In the production step of a semiconductor substrate, the step of forming a predetermined pattern is performed by etching a film to be etched, such as an interlayer dielectric film or a metal film, formed on a substrate such as a semiconductor wafer using a resist film as a mask material.

In recent years, a Cu multilayer wiring technique using a low dielectric constant film (Low-k film) as an interlayer dielectric film has attracted attention, and in such Cu multilayer wiring technique, a dual damascene method is adopted, in which embedded wiring gutters or holes are formed in the Low-k film and Cu is embedded therein. A lot of organic materials are also used as a Low-k film. When etching such organic Low-k film, because it is difficult to make a sufficient difference in an etching rate between the film and a resist, which is an organic film like the Low-k film, an inorganic hardmask film such as a Ti film or a TiN film is used as a mask for etching.

After etching, the resist film and hardmask film remaining on a substrate are required to be removed from the substrate. There has been known, as such removal method, for example, a method in which the films are removed using an organic amine-based removal solution, an ammonium fluoride-based removal solution including ammonium fluoride, an inorganic removal solution or the like in a sheet-type cleaning device (see Patent Document 1).

In addition, various photoresist films other than the hardmask film have also been widely used in various circuit manufacturing processes. While such photoresist film is formed on a substrate and various functional layers, it is often desired to remove the photoresist film without damaging the substrate and functional layers. In the manufacture of semiconductor devices, for example, an ion implanted photoresist film which has been used as a mask material for an ion implantation process is removed from the surface of a semiconductor substrate after ion implantation into the semiconductor substrate.

As a general method for removing a photoresist film, for example, there is a method using an organic solvent such as N-methyl-2-pyrrolidone (NMP), glycol ether, amines, or dimethyl sulfoxide (DMSO). As other methods for removing a photoresist film, there are a removal method by a wet chemical process using a chemical etching agent, for example sulfuric acid and hydrogen peroxide, a dry type reactive removal method by ashing, and the like. In a wet chemical process, a mixture of concentrated sulfuric acid and hydrogen peroxide, and a mixture of concentrated sulfuric acid and ozone can be used to remove a photoresist film.

As another specific method for removing a photoresist film, a method mentioned in U.S. Pat. No. 5,785,875 is known, in which after wet acid etching by completely immersing a wafer in an acid aqueous solution, the acid aqueous solution is extracted from an etching tank while introducing heated solvent vapor. Solvents used in such method are for example acetone and alcohols (preferably isopropanol), and solvent vapor is heated to a temperature from above about 50° C. to less than about 100° C.

As yet another removal method, a method using ozone dissolved in deionized water, and a method using heated vapor in which ozone gas and water vapor are mixed are known. In addition, a method using sulfuric acid or a dehydrated form or precursor of sulfuric acid (e.g. sulfur trioxide ($SO_3$), thiosulfuric acid ($H_2S_2O_3$), peroxymonosulfuric acid ($H_2S_2O_3$), peroxydisulfuric acid ($H_2S_2O_8$), fluorosulfuric acid ($HSO_3F$), and chlorosulfuric acid ($HSO_3Cl$)) is also known; however, in such method, a photoresist film cannot be necessarily removed well even when using a heated removal solution.

As can be seen from the fact that various removal methods have been suggested as mentioned above, a method in which a liquid sulfuric acid composition including water and sulfuric acid in a predetermined ratio is sprayed in accordance with controlled predetermined conditions is suggested as a method for removing a photoresist film well under circumstances that it is not necessarily easy to clean and remove the photoresist film well (see Patent Documents 2 to 5).

Patent Document 1: Japanese Unexamined Patent Application, Publication No. 2004-146594
Patent Document 2: Japanese Unexamined Patent Application, Publication No. 2010-157749
Patent Document 3: Japanese Unexamined Patent Application, Publication No. 2012-069994
Patent Document 4: Japanese Patent No. 4728402
Patent Document 5: Japanese Patent No. 4965673

DISCLOSURE OF THE INVENTION

Problems to be Solved by the Invention

In the method using an organic amine-based removal solution, an ammonium fluoride-based removal solution including ammonium fluoride, an inorganic removal solution or the like as mentioned in Patent Document 1, however, depending on materials for a resist film and a hardmask film, good removal cannot be carried out, layers other than a film to be removed, such as a substrate and an interlayer dielectric film, can be damaged, and deformation such as film loss can occur. In addition, the methods mentioned in Patent Documents 2 to 5 have a problem in that a special device and complicated control are required to supply a liquid sulfuric acid composition.

The present invention was made in view of the above problems, and an object thereof is to provide a cleaning composition, which can remove a layer to be treated well using conventional devices such as a coater, a baking furnace (curing furnace) and a cleaning chamber installed in semiconductor manufacturing equipment while preventing the damage and deformation of layers other than the layer to be treated, such as a substrate and an interlayer dielectric film; a cleaning method using said cleaning composition; and a method for manufacturing a semiconductor using said cleaning method.

Means for Solving the Problems

The present inventors found that a layer to be treated can be removed well using conventional devices such as a coater, a baking furnace (curing furnace) and a cleaning chamber installed in semiconductor manufacturing equipment by cleaning the layer to be treated formed on a substrate using a cleaning composition including a component (A) capable of decomposing the layer to be treated, and a film-forming polymer (B) while preventing the damage and deformation of layers other than the layer to be treated, such as a substrate and an interlayer dielectric film, thereby completing the present invention. Specifically, the present invention provides the following.

A first aspect of the present invention is a cleaning composition for cleaning a layer to be treated, formed on a substrate, wherein the cleaning composition includes a component (A) capable of decomposing the layer to be treated, and a film-forming polymer (B).

A second aspect of the present invention is a cleaning method, including the application step of forming a coating film by applying the cleaning composition according to the first aspect onto a layer to be treated, laminated on a substrate.

A third aspect of the present invention is a method for manufacturing a semiconductor using the cleaning method according to the second aspect.

Effects of the Invention

According to the present invention, it is possible to provide a cleaning composition which can remove a predetermined layer to be treated by using conventional devices such as a coater, a baking furnace (curing furnace) and a cleaning chamber installed in semiconductor manufacturing equipment while preventing the damage and deformation of layers other than the layer to be treated which is removed by cleaning, such as a substrate and an interlayer dielectric film; a cleaning method for removing the predetermined layer to be treated by cleaning using said cleaning composition; and a method for manufacturing a semiconductor using said cleaning method.

PREFERRED MODE FOR CARRYING OUT THE INVENTION

<<Cleaning Composition>>

The cleaning composition is used to clean a layer to be treated, formed on a substrate. The cleaning composition includes a component (A) capable of decomposing a layer to be treated, and a film-forming polymer (B). When applying such cleaning composition onto a layer to be treated, a coating film which remains at a certain position on the layer to be treated and does not freely flow is formed due to the action of the film-forming polymer (B). In addition, the cleaning composition has a certain degree of viscosity due to including the film-forming polymer (B). Because of this, it is thought that even when the removal of a layer to be treated by a cleaning composition proceeds and minute gaps are formed in the layer to be treated, the coating film made of the cleaning composition does not easily come into contact with layers other than the layer to be treated, damage layers other than the layer to be treated, and cause deformation. On the other hand, because the coating film made of the cleaning composition comes into contact with a layer to be treated, a component capable of decomposing the layer to be treated can be allowed to sufficiently affect the layer to be treated, and the layer to be treated can be removed well by cleaning.

A substrate which is treated by the cleaning composition and a layer to be treated, and essential or optional components included in the cleaning composition will now be described.

<Substrate>

There is no particular limitation on type of substrate. The substrate may be, for example, a substrate made of an inorganic material, such as a glass substrate or a metal substrate, or may be a resin substrate made of, for example, polyester such as PET, polycarbonate, and polyimide. The substrate is typically a semiconductor substrate such as a silicon substrate.

In addition, on the substrate, various other layers may be formed, in addition to a layer to be treated. Examples of other layers include an insulating layer, a conductive layer made of a conductive material, for example, metals and metal oxides such as ITO, a semiconductor layer, an anti-reflection layer, and the like. Examples of the insulating layer include a $SiO_2$ film, and a low dielectric constant film (Low-k film). Examples of the Low-k film include a SiOC film, a SiCOH film and the like, which are films with a relative dielectric constant lower than that of silicon dioxide.

On the substrate described above, a layer to be treated and, if necessary, other layers are laminated so as to form a desired layer structure.

<Layer to be Treated>

Materials for a layer to be treated are not particularly limited as long as the materials can be decomposed by a component (A). Examples of the layer to be treated include a layer made of a thermosetting cross-linking polymer or the like, and a photoresist film (especially an ion-implanted photoresist film used as a mask material for an ion implantation process). The layer to be treated is typically a hardmask film. When etching a layer to be etched on a substrate by e.g. microfabrication by a lithography process to form a pattern, a patterned layer made of a material having an etch selectivity ratio which is greatly different from that of the layer to be etched is formed, and the layer to be etched is etched using the patterned layer as a mask. A layer that has an etch selectivity ratio which is greatly different from that of the layer to be etched and is used as a mask is referred to as a hardmask. Materials for the hardmask film are not particularly limited, and can be an organic material or an inorganic material.

Examples of materials for an inorganic hardmask film include titanium (Ti), titanium nitride (TiN), silicon oxide ($SiO_2$), silicon nitride ($Si_3N_4$), silicon oxynitride (SiON), silicon nitride (SiN), silicon carbide (SiC), and silicon carbide nitride (SiCN), and the like.

In addition, a silicon-containing material having an organic group is also used as a material for the hardmask film. Examples of such silicon-containing material having an organic group include polycarbosilane, organopolysilazane, organopolysilane, organopolysiloxane, a copolymer of organopolysiloxane and a metal oxide (titanium oxide, aluminum oxide, tungsten oxide), and the like.

Examples of materials for an organic hardmask film (carbon hardmask film) include amorphous carbon and various resin materials. As the resin materials, a resin including an aromatic group, such as a novolak resin or a polyhydroxystyrene resin is preferably used. There has also been known, as a carbon hardmask film made of the resin including an aromatic group, for example, a hardmask film formed using a composition as mentioned in JP 4433933 B1.

Specifically, the composition mentioned in JP 4433933 B1 is a radiation-sensitive composition which includes a copolymer having a repeating unit represented by the following formula (1) and a repeating unit represented by the following formula (2), a radiation-sensitive acid generator and a solvent:

[Chem. 1]

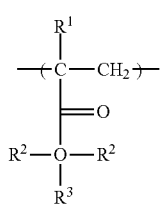
(1)

wherein, in the formula (1), $R^1$ represents a hydrogen atom or a monovalent organic group (excluding those having an epoxy group), each $R^2$ independently represents a hydrogen atom or a monovalent organic group (excluding those having an epoxy group), and $R^3$ represents a monovalent organic group having an epoxy group:

[Chem. 2]

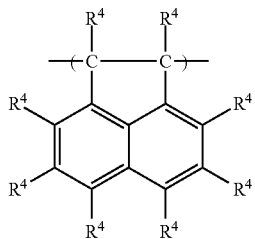
(2)

wherein, in the formula (2), each $R^4$ independently represents a hydrogen atom or a monovalent organic group (excluding those having an epoxy group).

The hardmask film formed by using such radiation-sensitive composition includes aromatic groups derived from a repeating unit represented by the formula (2) or ester bonds derived from a repeating unit represented by the formula (1). In addition, when epoxy groups represented by $R^3$ included in the repeating unit represented by the formula (1) react with each other, an ether bond can be formed. Thus, the hardmask film may include a polymer having ester bonds and ether bonds.

Furthermore, the hardmask film may include fluorine, chlorine and sulfur elements. For example, a fluorine-containing functional group may be introduced into a material for the hardmask film for various purposes, and when a laminate including the hardmask film is subjected to dry etching using a fluorine-containing gas, the material for the hardmask film may be also fluorinated.

Examples of other materials for a carbon hardmask film include materials mentioned in e.g. JP 5440755 B1, JP 5229044 B1, JP 5920588 B1, WO 2014/014034 A, JP 4639919 B1 and WO 2012/161126 A. The materials mentioned in the respective patent documents will be described below. It should be noted, however, that numbers and abbreviations for e.g. substituents in the general formulas are described using numbers mentioned in the respective patent documents, and thus the numbers may overlap with each other.

JP 5440755 B1 discloses a polymer including a structural unit represented by the following formula (1-1), (1-2), (1-3) or (1-4):

[Chem. 3]

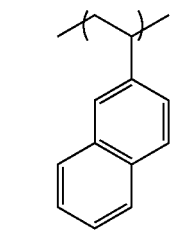
(1-1)

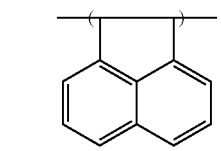
(1-2)

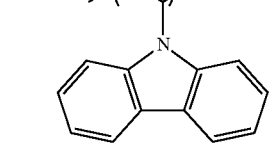
(1-3)

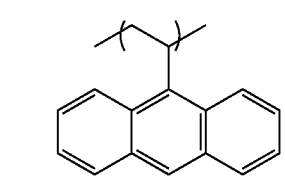
(1-4)

a structural unit represented by the following formula (2) and a structural unit represented by the following formula (3):

[Chem. 4]

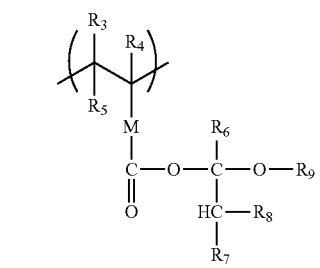
(2)

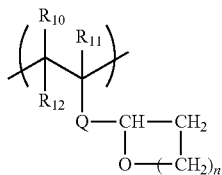

(3)

wherein, in the above formulas, $R_3$, $R_4$, $R_5$, $R_{10}$, $R_{11}$ and $R_{12}$ each represent a hydrogen atom, a halogen atom or an alkyl group having 1 to 3 carbon atoms, $R_6$, $R_7$ and $R_8$ each represent a hydrogen atom or a chain or cyclic alkyl group having 1 to 10 carbon atoms, $R_9$ represents a chain or cyclic alkyl group having 1 to 10 carbon atoms or an aromatic group having 6 to 20 carbon atoms, $R_7$ and $R_8$ may be combined with each other to form a ring, M and Q each represent a direct bond or a linking group, and n represents an integer of 0 or 1, wherein, when the total number of all structural units constituting said polymer is 1.0, the proportion of the number (a) of unit structures represented by the formula (1-1), formula (1-2), formula (1-3) or formula (1-4), the proportion of the number (b) of unit structures represented by the formula (2) and the proportion of the number (c) of unit structures represented by the formula (3) are $0.5 \leq a \leq 0.8$, $0.1 \leq b \leq 0.2$ and $0.1 \leq c \leq 0.3$.

The polymer usable as a carbon hardmask mentioned in JP 5440755 B1 has ester bonds derived from a unit represented by the formula (2). In addition, the unit represented by the formula (3) has an epoxy group (oxiranyl group) or an oxetanyl group, so that the polymer included in the carbon hardmask may have ether bonds by the reaction between these groups. Furthermore, the aromatic rings in the structural units represented by the formulas (1-1) to (1-4) may be also fluorinated by e.g. dry etching using a fluorine-containing gas.

JP 5229044 B1 mentions that it is possible to use, as a carbon hardmask, a polymer formed by using a composition including:

(A) a polymer having an aromatic ring, (B) a compound represented by the following formula (1):

[Chem. 5]

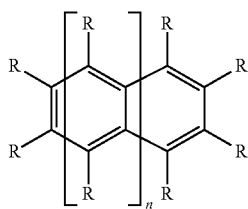

(1)

wherein, in the formula (1), a plurality of R's each independently represent a hydrogen atom, an adamantyl group or a glycidyl ether group, with the proviso that among the plurality of R's one or two substituents are an adamantyl group and one or two substituents are a glycidyl ether group, and n represents an integer of 0 to 3, and (C) an organic solvent.

JP 5229044 B1 also mentions that it is possible to suitably use a novolak resin as (A) a polymer having an aromatic ring.

The polymer mentioned in JP 5229044 B1 usable as a carbon hardmask has, for example, ether bonds formed by a reaction between a phenolic hydroxy group, and a glycidyl group of the compound represented by the formula (1), when (A) the polymer having an aromatic ring is a novolak resin. Furthermore, (A) the polymer having an aromatic ring or the aromatic rings derived from the compound represented by the formula (1) may be also fluorinated by e.g. dry etching using a fluorine-containing gas.

JP 5920588 B1 mentions a polymer including a structural unit represented by the following formula (2):

(2)

wherein, in the formula (2), $Ar_2$, $Ar_a$ and $Ar_4$ each represent an organic group including an arylene group having 6 to 50 carbon atoms, and T represents a carbonyl group, or a combination of a structural unit represented by the following formula (1):

(1)

wherein, in the formula (1), $Ar_1$ represents an arylene group having 6 to 50 carbon atoms or an organic group including a heterocyclic group, and the structural unit represented by the above formula (2).

The polymer mentioned in JP 5229044 B1 usable as a carbon hardmask is an aromatic polyether and thus inevitably has ether bonds. Furthermore, the aromatic rings included in the polymer mentioned in JP 5229044 B1 may be also fluorinated by e.g. dry etching using a fluorine-containing gas.

WO 2014/014034 A mentions a polymer formed by using a composition which includes a resin having an aromatic ring, and a crosslinking agent having a partial structure represented by the following formula (i):

(i)

wherein, in the formula (i),

X is a carbonyl group or a sulfonyl group,

Q is a monovalent heteroaromatic group or —OR', $R^1$ is a monovalent organic group having 1 to 30 carbon atoms, Ar is an aromatic hydrocarbon group or a heteroaromatic group, n is an integer of 1 to 8, and when n is 2 or more, a plurality of X's and Q's may be the same or different.

WO 2014/014034 A mentions, as specific examples of the resin including an aromatic ring, a novolak resin, a polyarylene-based resin such as a polyarylene ether and the like, and discloses, as specific examples of the crosslinking agent, compounds having the following structures. A polymer produced by crosslinking a novolak resin with a crosslinking agent having a structure shown below includes ester bonds. A polymer produced by crosslinking a polyarylene ether with a crosslinking agent having a structure shown below includes ether bonds and ester bonds. When using a crosslinking agent including a 1,1,1,3,3,3-hexafluoropropan-2-yl group, a polymer produced can include fluorine atoms. Furthermore, the aromatic rings included in the polymer mentioned in WO 2014/014034 A may be also fluorinated by e.g. dry etching using a fluorine-containing gas.

[Chem. 6]

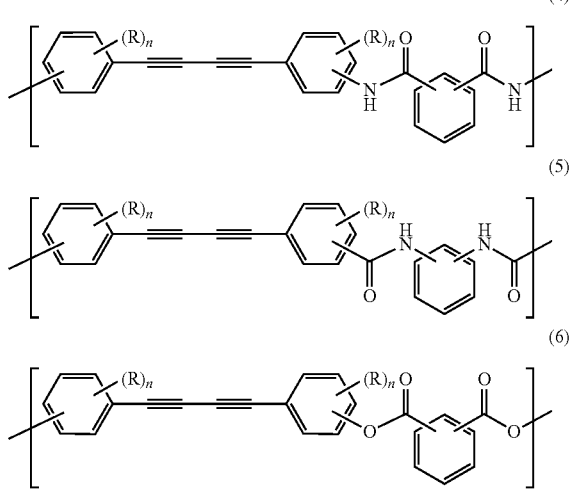

JP 4639919 B1 mentions use of a film formed by using a composition which includes a polymer having a structural unit represented by the following formulas (4) to (6):

[Chem. 7]

wherein, in the formulas (4) to (6), R represents a methyl group and n represents an integer of 0 or 1, as a hardmask film (see paragraphs [0035] to [0037]).

In addition, JP 4639919 B1 mentions that the composition may include, in addition to the above-mentioned polymer, various resins such as polyethers, polyamides, polyesters and polyimides (see paragraphs [0063] to [0065]). In other words, a hardmask film formed by using the composition mentioned in JP 4639919 B1 can include not only amide bonds and ester bonds derived from the structural units represented by the formulas (4) to (6) but also ether bonds, amide bonds, ester bonds and imide bonds derived from a binder resin. Furthermore, the aromatic rings included in a hardmask film formed by using the composition mentioned in JP 4639919 B1 may be also fluorinated by e.g. dry etching using a fluorine-containing gas.

WO 2012/161126 A mentions, as a polymer usable as a carbon hardmask, a carbon hardmask film formed by using a composition which includes a polymer (A) including a structural unit represented by the following formula (1) and a structural unit represented by the following formula (2):

[Chem. 8]

wherein, in the formula (1), $R_1$ represents a hydrogen atom or a methyl group, $R^2$ represents an alkylene group having 1 to 3 carbon atoms or an optionally substituted phenylene group, and $R^3$ represents a hydroxy group or a carboxy group, wherein, in the formula (2), $R^4$ represents a hydrogen atom or a methyl group, Y represents a linking group represented by a —C(=O)—NH— group or a —C(=O)—O— group, X represents a group including a lactone ring, a group including an adamantane ring, or an optionally substituted benzene ring group, an optionally substituted naphthalene ring group or an optionally substituted anthracene ring group, and the carbon atom of the linking group represented by the above Y is combined with a main chain of the polymer, a crosslinkable compound (B) having at least two groups of a blocked isocyanate group, a methylol group or an alkoxymethyl group having 1 to 5 carbon atoms, and a solvent (C).

The polymer included in the hardmask film formed by using the composition mentioned in WO 2012/161126 A has amide bonds derived from a structural unit represented by formula (1) or a structural unit represented by formula (2), and ester bonds derived from a structural unit represented by formula (2).

As mentioned in several aforementioned patent documents, a film formed by using a composition including a polymer having a desired structure and a crosslinking agent is preferably used as a carbon hardmask film. Examples of general crosslinking agents mixed in a composition for forming a carbon hardmask film include a melamine-based crosslinking agent, a substituted urea-based crosslinking agent mentioned in JP 5920588 B1, or oligomers or polymers thereof, and the like. A crosslinking agent having at least two cross-link-forming substituents is preferable, and it is possible to particularly preferably use, as the crosslinking agent, for example, a compound such as methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea or methoxymethylated thiourea, and a compound including a cross-link-forming substituent having an aromatic ring (e.g., benzene ring, naphthalene ring) in the molecule, which is a crosslinking agent having high heat resistance mentioned in paragraph [0035] of JP 5867732 B1.

Examples of such compounds include a compound having a partial structure represented by the following formula (4), and a polymer or oligomer having a repeating unit represented by the following formula (5):

[Chem. 9]

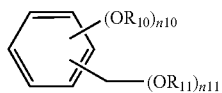 (4)

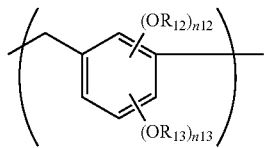 (5)

In the formula (4), $R_{10}$ and $R_{11}$ each represent a hydrogen atom, an alkyl group having 1 to 10 carbon atoms, or an aryl group having 6 to 20 carbon atoms, n10 represents an integer of 1 to 4, n11 represents an integer of 1 to (5-n10), and (n10+n11) represents an integer of 2 to 5. In the formula (5), $R_{12}$ represents a hydrogen atom or an alkyl group having 1 to 10 carbon atoms, $R_{13}$ represents an alkyl group having 1 to 10 carbon atoms, n12 represents an integer of 1 to 4, n13 represents 0 to (4-n12), and (n12+n13) represents an integer of 1 to 4. The oligomer and polymer can be used in a range where the number of the repeating unit structures is 2 to 100, or 2 to 50.

In order that a hardmask film and a photoresist film made of the above-described materials can be removed well, a component (A) capable of decomposing a layer to be treated described below is properly selected.

<Component (A) Capable of Decomposing Layer to be Treated>

The type of component (A) capable of decomposing a layer to be treated (hereinafter, also referred to as component (A)) is properly selected depending on materials for the layer to be treated and is not particularly limited. Here, the decomposition of a layer to be treated includes not only cleaving a chemical bond such as a covalent bond in a molecule of a material constituting the layer to be treated but also a reaction of the layer to be treated with a component (A) to an extent in which the layer to be treated can be easily cleaned and removed by e.g. rinsing. In modification of the layer to be treated by such reaction, for example, solubilization of the layer to be treated in a cleaning composition or a rinse solution is included. Typically, the component (A) is properly selected from a basic compound (A1), an acidic compound (A2), an oxidizing agent (A3), and a reducing agent (A4) and the like. It should be noted that two or more selected from a basic compound (A1), an acidic compound (A2), an oxidizing agent (A3), and a reducing agent (A4) and the like can be used in combination without losing a cleaning effect.

The component (A) is preferably at least one selected from the group consisting of a basic compound (A1) and an acidic compound (A2) from the viewpoint that it is easy to decompose various materials well.

(Basic Compound (A1))

The basic compound (A1) is preferably used as the component (A), for example when cleaning a layer to be treated including a material having a bond which can be cleaved in the presence of a base, such as an ester bond (—CO—O—), a carbonate bond (—CO—O—CO—), an amide bond (—CO—NH—), or a urethane bond (—NH—CO—NH—). The type of basic compound (A1) is not particularly limited as long as a layer to be treated can be decomposed, and the basic compound (A1) can be an organic base or an inorganic base.

Examples of the inorganic base include metal hydroxides, metal hydrogen carbonates, and metal bicarbonates. Suitable specific examples of the inorganic base include metal hydroxides such as lithium hydroxide, potassium hydroxide, sodium hydroxide, rubidium hydroxide, cesium hydroxide, magnesium hydroxide, calcium hydroxide, strontium hydroxide, and barium hydroxide; metal carbonates such as lithium carbonate, potassium carbonate, sodium carbonate, rubidium carbonate, cesium carbonate, magnesium carbonate, calcium carbonate, strontium carbonate, and barium carbonate; metal bicarbonates such as lithium hydrogen carbonate, potassium hydrogen carbonate, sodium hydrogen carbonate, rubidium hydrogen carbonate, and cesium hydrogen carbonate, and the like.

The inorganic bases are preferably an alkali metal hydroxide and an alkali metal carbonate, more preferably sodium hydroxide, potassium hydroxide, sodium carbonate, and potassium carbonate, and particularly preferably sodium hydroxide, and potassium hydroxide.

Examples of the organic base include amines such as ethylamine, n-propylamine, ethanolamine, diethylamine, di-n-propylamine, diethanolamine, triethylamine, methyldiethylamine, dimethylethanolamine, and triethanolamine; cyclic basic compounds such as pyrrole, piperidine, 1,8-diazabicyclo[5,4,0]-7-undecene, and 1,5-diazabicyclo[4,3,0]-5-nonane; and quaternary ammonium salts such as tetramethylammonium hydroxide (TMAH), tetraethylammonium hydroxide, tetrapropylammonium hydroxide (TPAH), tetrabutylammonium hydroxide, methyltripropylammonium hydroxide, methyltributylammonium hydroxide, benzyltrimethylammonium hydroxide, benzyltriethylammonium hydroxide, and trimethyl(2-hydroxyethyl)ammonium hydroxide, and the like.

The basic compound (A1) is preferably at least one selected from the group consisting of a quaternary ammonium salt and an inorganic base because they are cheap and easily available and easily decompose a layer to be treated well. The basic compound (A1) is more preferably at least one selected from the group consisting of tetramethylammonium hydroxide (TMAH), tetraethylammonium hydroxide, tetrapropylammonium hydroxide (TPAH), potassium hydroxide, and sodium hydroxide.

(Acidic Compound (A2))

The acidic compound (A2) is preferably used as the component (A), for example when cleaning a layer to be treated including a material having a bond which can be cleaved in the presence of an acid, such as an ester bond (—CO—O—), a carbonate bond (—CO—O—CO—), an amide bond (—CO—NH—), or a urethane bond (—NH—CO—NH—). The type of acidic compound (A2) is not particularly limited as long as a layer to be treated can be decomposed, and the acidic compound (A2) can be an organic acid or an inorganic acid.

Suitable examples of the organic acid include aliphatic carboxylic acids (e.g. acetic acid, propionic acid), fluorinated aliphatic carboxylic acids (e.g. trifluoroacetic acid, etc.), alkanesulfonic acids (e.g. methanesulfonic acid, dodecanesulfonic acid, etc.), arylsulfonic acids (e.g. benzenesulfonic acid, p-toluenesulfonic acid, etc.), fluorinated alkylsulfonic acids (e.g. trifluoromethanesulfonic acid, pentafluoroethanesulfonic acid, heptafluoropropanesulfonic acid, nonafluorobutanesulfonic acid, undecafluoropentanesulfonic acid and tridecafluorohexanesulfonic acid) and the like. The number of carbon atoms in an organic acid is not particularly limited, and is preferably 1 to 30, and more preferably 1 to 10.

Suitable examples of the inorganic acid include hydrochloric acid (hydrogen chloride), hydrobromic acid, hydroiodic acid, hydrofluoric acid, nitric acid, sulfuric acid, phosphoric acid and the like.

In addition, among the acidic compounds (A2), Lewis acids showing Lewis acidity can cleave an ether bond well. In addition, hydrogen halides such as hydrobromic acid and hydroiodic acid can be also used to cleave an ether bond. Hydrogen halides such as hydrobromic acid and hydroiodic acid, and acidic compounds (A2) showing Lewis acidity are preferably used when cleaning a layer to be treated including a material having ether bonds. Suitable examples of such Lewis acids include a fluorinated alkyl sulfonic acid. The fluorinated alkyl sulfonic acid is preferably at least one selected from the group consisting of trifluoromethanesulfonic acid, pentafluoroethanesulfonic acid, heptafluoropropanesulfonic acid, and nonafluorobutanesulfonic acid.

Cleaning compositions including these fluorinated alkyl sulfonic acids have an excellent affinity (wettability) for a hardmask film, particularly a hardmask film including elemental fluorine. Because of this, when using a cleaning composition including a fluorinated alkyl sulfonic acid, it is easy to clean and remove a hardmask film, particularly a hardmask film including elemental fluorine well.

(Oxidizing Agent (A3))

The oxidizing agent (A3) is preferably used as the component (A), for example when cleaning a layer to be treated made of a material having a bond which is easily cleaved by an oxidizing agent, such as a —CO—NH—NH—CO— bond, and a layer to be treated which is an inorganic hardmask film. Examples of the oxidizing agent which can be used as the component (A3) include peroxides, periodic acid, periodates, permanganates, vanadates, hypochlorites, iron oxides, ozone and the like. Specific examples of peroxides include hydrogen peroxide, peracetic acid, peroxybenzoic acid, m-chloroperoxybenzoic acid, percarbonates, urea hydrogen peroxide, and perchloric acid; perchlorates; and persulfates such as sodium persulfate, potassium persulfate, and ammonium persulfate, and the like.

(Reducing Agent (A4))

The reducing agent (A4) is preferably used as the component (A), for example when cleaning a layer to be treated including a material having a bond which is easily cleaved by a reducing agent, such as a disulfide bond. Examples of the reducing agent which can be used as the component (A) include hydrazine compounds such as hydrazine, hydrazine hydrochloride, hydrazine sulfate, and hydrazine hydrate; metal salts such as sodium borohydride, sodium sulfite, sodium hydrogen sulfite, sodium thiosulfate, sodium nitrite, sodium hyponitrite, sodium phosphite, and sodium hypophosphite; phosphorous acid; hypophosphorous acid; aldehydes; alcohols; amines; saccharides and the like.

The amount of component (A) included in a cleaning agent composition is not particularly limited as long as a layer to be treated can be removed to a desired extent on desired cleaning conditions. In addition, the amount of component (A) included is properly adjusted to an appropriate amount depending on the types of component (A). Typically, the amount of component (A) included in a cleaning agent composition is preferably 5 to 150 mass %, more preferably 30 to 130 mass % and particularly preferably 90 to 120 mass % with respect to the mass of polymer solution (the total sum of the mass of film-forming polymer (B) and the mass of solvent).

<Film-Forming Polymer (B)>

The film-forming polymer (B) (hereinafter, referred to as component (B)) is not particularly limited as long as it is a polymer which can impart a film-forming ability by which a cleaning composition does not excessively flow on a layer to be treated, to the cleaning composition.

There is a risk that, when a film-forming polymer (B) itself is decomposed by a component (A), a coated film made of a cleaning composition easily flows, and comes into contact with the cleaning composition even at an undesired site, and layers such as a substrate and an interlayer dielectric film other than a layer to be treated can be damaged. In addition, the film-forming polymer (B) has the action of holding a component (A) in a coating film made of a cleaning composition. Because of this, when using a cleaning composition including a film-forming polymer (B), a component (A) can be diffused from a coating film well. However, when a film-forming polymer (B) is decomposed, because a component (A) is not held in a coating film, it is required to take a long period of time to clean and remove a layer to be treated, and it is difficult to clean and remove the layer to be treated well. Therefore, it is preferred that a film-forming polymer (B) be resistant to a component (A).

The type of film-forming polymer (B) is not particularly limited as long as a uniform cleaning composition can be prepared. Suitable examples of the film-forming polymer (B) include at least one selected from the group consisting of a polymer having a constitutional unit derived from (meth)acrylic acid, a polymer having a constitutional unit derived from a vinyl group-containing compound, and a polysaccharide.

(Polymer Having Constitutional Unit Derived from (Meth) Acrylic Acid)

The polymer having a constitutional unit derived from (meth)acrylic acid can be a homopolymer of (meth)acrylic acid or a copolymer of (meth)acrylic acid and another monomer. The polymer having a constitutional unit derived from (meth)acrylic acid is highly resistant to a component (A), but is highly resistant to an acidic compound (A2) and can form a salt with a basic compound (A1), and thus is preferably used together with an acidic compound (A2).

Suitable examples of monomers which may be copolymerized with (meth)acrylic acid include unsaturated carboxylic acids other than (meth)acrylic acid, (meth)acrylic acid esters, (meth)acrylamides, allyl compounds, and styrenes and the like.

Examples of unsaturated carboxylic acids other than (meth)acrylic acid include (meth)acrylic acid amide, crotonic acid, maleic acid, fumaric acid, citraconic acid, mesaconic acid, itaconic acid and the like.

Examples of (meth)acrylic acid esters include straight or branched alkyl (meth)acrylates such as methyl (meth)acrylate, ethyl (meth)acrylate, propyl (meth)acrylate, amyl (meth)acrylate, and t-octyl (meth)acrylate; chloroethyl (meth)acrylate, 2,2-dimethyl hydroxypropyl (meth)acrylate, 2-hydroxy ethyl (meth)acrylate, trimethylolpropane mono (meth)acrylate, benzyl (meth)acrylate, furfuryl (meth)acrylate; and (meth)acrylic acid esters having a group having an alicyclic skeleton. In the (meth)acrylic acid esters having a group having an alicyclic skeleton, an alicyclic group constituting an alicyclic skeleton can be monocyclic or polycyclic. Examples of monoalicyclic groups include a cyclopentyl group, a cyclohexyl group and the like. In addition, examples of polyalicyclic groups include a norbornyl group, an isobornyl group, a tricyclononyl group, a tricyclodecyl group, a tetracyclododecyl group and the like.

Examples of (meth)acrylamides include (meth)acrylamide, N-alkyl (meth)acrylamide, N-aryl (meth)acrylamide, N,N-dialkyl (meth)acrylamide, N,N-aryl (meth)acrylamide, N-methyl-N-phenyl (meth) acrylamide, N-hydroxyethyl-N-methyl (meth) acrylamide and the like.

Examples of allyl compounds include allyl esters such as allyl acetate, allyl caproate, allyl caprylate, allyl laurate, allyl palmitate, allyl stearate, allyl benzoate, allyl acetoacetate, and allyl lactate; allyloxyethanol; and the like.

Examples of styrenes include styrene; alkylstyrenes such as methylstyrene, dimetylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, ethoxymethylstyrene, and acetoxymethylstyrene; alkoxystyrenes such as methoxystyrene, 4-methoxy-3-methylstyrene, and dimethoxystyrene; halostyrenes such as chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene, and 4-fluoro-3-trifluoromethylstyrene; and the like.

The amount of constitutional unit derived from (meth)acrylic acid included in a polymer having a constitutional unit derived from (meth)acrylic acid is preferably 70 mol % or more, more preferably 80 mol % or more, particularly preferably 90 mol % or more, and most preferably 100 mol %. That is, polymethacrylic acid, and polyacrylic acid are most preferred.

(Polymer Having Constitutional Unit Derived from Vinyl Group-Containing Compound)

The polymer having a constitutional unit derived from a vinyl group-containing compound can be a homopolymer of a vinyl group-containing compound, or a copolymer of a vinyl group-containing compound and another monomer. It should be noted that (meth)acrylic acid or derivatives thereof are not included in the vinyl group-containing compound.

Examples of the vinyl group-containing compound include N-vinylcarboxylic acid amides, vinylethers, vinyl esters, and acid group-containing vinyl compounds and the like.

Examples of N-vinylcarboxylic acid amides include N-vinylacetamide, N-vinylpropionamide, N-vinylbenzoic acid amide and the like.

Examples of vinylethers include aliphatic vinylethers such as hexyl vinylether, octyl vinylether, decyl vinylether, ethylhexyl vinylether, methoxyethyl vinylether, ethoxyethyl vinylether, chloroethyl vinylether, 1-methyl-2,2-dimethylpropyl vinylether, 2-ethylbutyl vinylether, hydroxyethyl vinylether, diethylene glycol vinylether, dimethyl aminoethyl vinylether, diethyl aminoethyl vinylether, butyl aminoethyl vinylether, benzyl vinylether, and tetrahydrofurfuryl vinylether; vinyl aryl ethers such as vinyl phenyl ether, vinyl tolyl ether, vinyl chlorophenyl ether, vinyl-2,4-dichlorophenyl ether, vinyl naphthyl ether, and vinyl anthranyl ether; and the like.

Examples of vinyl esters include vinyl butyrate, vinyl isobutyrate, vinyl trimethyl acetate, vinyl diethyl acetate, vinyl valerate, vinyl caproate, vinyl chloroacetate, vinyl dichloroacetate, vinyl methoxyacetate, vinyl butoxyacetate, vinyl phenylacetate, vinyl acetoacetate, vinyl lactate, vinyl-β-phenyl butyrate, vinyl benzoate, vinyl salicylate, vinyl chlorobenzoate, vinyl tetrachlorobenzoate, vinyl naphthoate and the like.

Examples of acid group-containing vinyl compounds include vinylsulfonic acid, vinylphosphonic acid and the like.

Among the above-mentioned vinyl group-containing compounds, N-vinylcarboxylic acid amides, and acid group-containing vinyl compounds are preferred, N-vinylacetamide, N-vinylpropionamide, vinylsulfonic acid, and vinylphosphonic acid are more preferred, and N-vinylacetamide, vinylsulfonic acid, and vinylphosphonic acid are particularly preferred from the viewpoint of e.g. easy availability and resistance to a component (A).

Suitable examples of monomers which may be copolymerized with a vinyl group-containing compound include unsaturated carboxylic acids other than (meth)acrylic acid, (meth)acrylic acid esters, (meth)acrylamides, allyl compounds, and styrenes and the like. Suitable examples thereof are as described above. It should be noted that a copolymer of monomers including (meth)acrylic acid and a vinyl group-containing compound can be also used as the component (B).

The amount of constitutional unit derived from a vinyl group-containing compound included in a polymer having a constitutional unit derived from the vinyl group-containing compound is preferably 70 mol % or more, more preferably 80 mol % or more, particularly preferably 90 mol % or more, and most preferably 100 mol %. Examples of particularly preferred polymers as a polymer having a constitutional unit derived from a vinyl group-containing compound include poly(N-vinylacetamide), polyvinylsulfonic acid, and polyvinylphosphonic acid. Poly(N-vinylacetamide) is highly resistant to a component (A) but is particularly highly resistant to a basic compound (A1), and thus is preferably used together with a basic compound (A1). Polyvinylsulfonic acid, and polyvinylphosphonic acid are highly resistant to a component (A), but are highly resistant to an acidic compound (A2) and can form a salt with a basic compound (A1), and thus are preferably used together with an acidic compound (A2).

(Polysaccharide)

Examples of the polysaccharide include starches, celluloses, agarose, xanthan gum, guar gum, glucomannan, curdlan, carrageenan, xanthan gum, gellan gum, dextran, locust bean gum, alginic acids, and hyaluronic acids, and the like.

The molecular weight of the component (B) described above is not particularly limited. The molecular weight of the component (B) is preferably 50,000 to 2,000,000, and more preferably 100,000 to 1,250,000 for example as a mass average molecular weight (Mw) in terms of polystyrene.

The amount of component (B) included in a cleaning composition is not particularly limited without defeating the object of the present invention. The amount of component (B) used is preferably 1 to 30 mass %, more preferably 2 to 20 mass %, and particularly preferably 3 to 15 mass % with respect to the mass of polymer solution (the total sum of the mass of component (B) and the mass of solvent).

<Solvent>

It is preferred that the cleaning composition include a solvent to impart moderate properties of application to the surface of a layer to be treated, to the cleaning composition. It should be noted that when a basic compound (A1) and an acidic compound (A2) are in a liquid form at a temperature at which a cleaning composition is used, the cleaning composition can be prepared without using a solvent. Such solvent is preferably at least one selected from the group consisting of water and an organic solvent.

The solvent preferably includes water and more preferably is water, for example because hydrolysis reaction often relates to the decomposition of a layer to be treated by a component (A) and it is easy to clean a substrate after cleaning treatment. When the solvent is an aqueous solvent, the amount of water included in the solvent is preferably 50 mass % or more, more preferably 70 mass % or more and particularly preferably 90 mass % or more.

Specific examples of organic solvents which can be used as a solvent include:

sulfoxides such as dimethyl sulfoxide;

sulfones such as dimethylsulfone, diethylsulfone, bis(2-hydroxyethyl)sulfone, and tetramethylenesulfone;

amides such as N,N-dimethylformamide, N-methylformamide, N,N-dimethylacetamide, N-methylacetamide, and N,N-diethylacetamide;

lactams such as N-methyl-2-pyrrolidone, N-ethyl-2-pyrrolidone, N-propyl-2-pyrrolidone, N-hydroxymethyl-2-pyrrolidone, and N-hydroxyethyl-2-pyrrolidone;

imidazolidinones such as 1,3-dimethyl-2-imidazolidinone, 1,3-diethyl-2-imidazolidinone, and 1,3-diisopropyl-2-imidazolidinone;

polyalcohols such as ethylene glycol, propylene glycol, 1,2-butylene glycol, 1,3-butylene glycol, 2,3-butylene glycol, glycerin, and diethylene glycol;

dialkyl glycol ethers such as dimethyl glycol, dimethyl diglycol, dimethyl triglycol, methyl ethyl diglycol, diethyl glycol, diethyl diglycol, triethylene glycol butyl methyl ether, and tetraethylene glycol dimethyl ether;

(poly)alkylene glycol monoalkyl ethers such as ethylene glycol monomethyl ether, ethylene glycol monoethyl ether, ethylene glycol mono-n-propyl ether, ethylene glycol mono-n-butyl ether, ethylene glycol monoallyl ether, diethylene glycol monomethyl ether, diethylene glycol monoethyl ether, diethylene glycol mono-n-propyl ether, diethylene glycol mono-n-butyl ether, diethylene glycol monobenzyl ether, triethylene glycol monomethyl ether, triethylene glycol monoethyl ether, triethylene glycol mono-n-propyl ether, triethylene glycol mono-n-butyl ether, propylene glycol monomethyl ether, propylene glycol monoethyl ether, propylene glycol mono-n-propyl ether, propylene glycol mono-n-butyl ether, dipropylene glycol monomethyl ether, dipropylene glycol monoethyl ether, dipropylene glycol mono-n-propyl ether, dipropylene glycol mono-n-butyl ether, tripropylene glycol monomethyl ether, tripropylene glycol monoethyl ether, tripropylene glycol mono-n-propyl ether, tripropylene glycol monobutyl-n-ether, and 3-methoxy-3-methyl-1-butanol;

(poly)alkylene glycol esters such as ethylene glycol monoacetate, propylene glycol monoacetate, diethylene glycol monoacetate, and dipropylene glycol monoacetate;

(poly)alkylene glycol monoalkyl ether acetates such as ethylene glycol monomethyl ether acetate, ethylene glycol monoethyl ether acetate, diethylene glycol monomethyl ether acetate, diethylene glycol monoethyl ether acetate, propylene glycol monomethyl ether acetate, and propylene glycol monoethyl ether acetate;

other ethers such as dimethyl ether, diethyl ether, methylethyl ether, dipropyl ether, diisopropyl ether, dibutyl ether, diisoamyl ether, diethylene glycol dimethyl ether, diethylene glycol methylethyl ether, diethylene glycol diethyl ether, and tetrahydrofuran;

ketones such as methylethyl ketone, cyclohexanone, 2-heptanone, and 3-heptanone;

alkyl lactic acid esters such as methyl 2-hydroxypropionate, and ethyl 2-hydroxypropionate; other esters such as ethyl 2-hydroxy-2-methylpropionate, methyl 3-methoxypropionate, ethyl 3-methoxypropionate, methyl 3-ethoxypropionate, ethyl 3-ethoxypropionate, ethyl ethoxyacetate, ethyl hydroxyacetate, methyl 2-hydroxy-3-methylbutanoate, 3-methyl-3-methoxybutyl acetate, 3-methyl-3-methoxybutyl propionate, ethyl acetate, n-propyl acetate, i-propyl acetate, n-butyl acetate, i-butyl acetate, n-pentyl formate, i-pentyl acetate, n-butyl propionate, ethyl butyrate, n-propyl butyrate, i-propyl butyrate, n-butyl butyrate, methyl pyruvate, ethyl pyruvate, n-propyl pyruvate, methyl acetoacetate, ethyl acetoacetate, and ethyl 2-oxobutanoate;

lactones such as β-propiolactone, γ-butyrolactone and δ-pentyrolactone;

straight, branched or cyclic aliphatic hydrocarbons such as n-hexane, n-heptane, n-octane, n-nonane, methyloctane, n-decane, n-undecane, n-dodecane, 2,2,4,6,6-pentamethyl heptane, 2,2,4,4,6,8,8-heptamethyl nonane, cyclohexane, and methylcyclohexane;

aromatic hydrocarbons such as benzene, toluene, xylene, 1,3,5-trimethylbenzene, and naphthalene;

terpenes such as p-menthane, diphenyl menthane, limonene, terpinene, bornane, norbornane, and pinane; and the like.

<Other Components>

The cleaning composition may include, in addition to the above-mentioned components, various additives without defeating the object of the present invention. Examples of such additives include an antioxidant, an ultraviolet absorbing agent, a surface-active agent, a pH adjuster, and a metal corrosion inhibitor, and the like.

<Method for Manufacturing Cleaning Composition>

The cleaning composition can be prepared by uniformly mixing the components described above in respective desired amounts. To remove molten residue and insoluble impurities during preparation, the cleaning composition may be filtered through a filter as needed.

<<Cleaning Method>>

The cleaning composition described above is suitably used to remove a layer to be treated by cleaning. Specifically, the cleaning method is a method including the application step of forming a coating film by applying a cleaning composition onto a predetermined layer to be treated, laminated on the above substrate.

Specific examples of methods for applying a cleaning composition onto a layer to be treated on a substrate include a spin coating method, a spray method, a roller coating method and the like. The application method is preferably a spin coating method because it is easy to uniformly apply a cleaning composition. In addition, a coating film may be formed by putting a solution of a cleaning composition on the surface of a layer to be treated.

Thus, by forming a coating film made of a cleaning composition onto a layer to be treated, a component (A) is diffused from the coating film, thereby cleaning and removing the layer to be treated.

The cleaning method preferably has the heating step of heating a coating film. That is, a coating film formed on a layer to be treated is preferably heated. Therefore, it is easy to clean and remove a layer to be treated quickly and well. The typical heating temperature for a coating film is preferably 100 to 250° C., and more preferably 150 to 200° C. The heating time is not particularly limited, and in general is preferably 30 to 600 seconds, and more preferably 120 to 300 seconds.

In addition, it is preferred that the cleaning method have the heating step of heating a coating film at a temperature of not lower than the glass transition temperature of a component (B) and not lower than the boiling point of a component (A). It is easy to clean and remove a layer to be treated particularly quickly and well by heating a coating film on such conditions. In general, the heating time is preferably 30 to 600 seconds, and more preferably 120 to 300 seconds.

It is preferred that the cleaning method have the rinsing step of removing a coating film and a layer to be treated from a substrate by supplying a rinse solution. A clean substrate in which a coating film and a layer to be treated have been removed can be obtained by carrying out the above-mentioned rinsing step after forming the coating film and, optionally, heating the coating film. The type of rinse solution is not particularly limited as long as a desired cleaning effect is obtained. As the rinse solution, for example, water and an alcohol such as methanol, ethanol, n-propanol, or isopropanol can be used. To the rinse solution, an acid or a base can be added as needed. As the acid and base, the basic compound (A1) and acidic compound (A2) described as the components for the cleaning composition can be used.

According to the above-mentioned cleaning method, it is possible to remove a layer to be treated such as a hardmask film well using conventional devices such as a coater, a baking furnace (curing furnace) and a cleaning chamber installed in semiconductor manufacturing equipment while preventing the damage and deformation of layers other than the layer to be treated, such as a substrate and an interlayer dielectric film. Because of this, the above-mentioned cleaning method can be suitably applied to a method for manufacturing a semiconductor, particularly a method for manufacturing a semiconductor including a dual damascene method.

EXAMPLES

The present invention will now be described in more detail by way of Examples. It should be noted, however, that the present invention is not limited to these Examples.

Example 1

A cleaning composition, which is an aqueous solution including 50 mass % of trifluoromethanesulfonic acid and 6.25 mass % of polyacrylic acid (mass average molecular weight 250,000), was applied onto a carbon hardmask film (film thickness 80 nm) including a polymer including ester bonds, ether bonds and elemental fluorine, formed on a silicon substrate. After application a coating film was heated at 180° C. for 150 seconds. After heating, rinsing was carried out with a weakly basic water-water soluble ether mixed liquid, followed by further water rinsing. The surface of the substrate after water rinsing was observed with a microscope, and the carbon hardmask film was removed well and the film thickness of the substrate was hardly reduced.

Example 2

A cleaning composition, which is an aqueous solution including 6.25 mass % of tetramethylammonium hydroxide and 1 mass % of poly(N-vinylacetamide) (mass average molecular weight 1,200,000), was applied onto a carbon hardmask film (film thickness 80 nm) including a polymer including ester bonds, ether bonds and elemental fluorine, formed on a silicon substrate. After application a coating film was heated at 200° C. for 300 seconds. After heating, water rinsing was carried out. The surface of the substrate after water rinsing was observed with a microscope, and the carbon hardmask film was removed well and the film thickness of the substrate was hardly reduced.

Example 3

A cleaning composition, which is an aqueous solution including 6.25 mass % of tetramethylammonium hydroxide, 200 ppm by mass of potassium hydroxide and 1 mass % of poly(N-vinylacetamide) (mass average molecular weight 1,200,000), was applied onto a carbon hardmask film (film thickness 80 nm) including a polymer including ester bonds, ether bonds and elemental fluorine, formed on a silicon substrate. After application a coating film was heated at 120° C. or 140° C. for 300 seconds. After heating, water rinsing was carried out. The surface of the substrate after water rinsing was observed with a microscope, and the carbon hardmask film was removed well and the film thickness of the substrate was hardly reduced both in the case of heating at 120° C. and the case of heating at 140° C.

Example 4

A cleaning composition, which is an aqueous solution including 50 mass % of trifluoromethanesulfonic acid and 10 mass % of polyvinylsulfonic acid (mass average molecular weight 100,000), was applied onto a carbon hardmask (film thickness 80 nm) including a polymer including ester bonds, ether bonds and elemental fluorine, formed on a silicon substrate. After application a coating film was heated at 180° C. for 150 seconds. After heating, rinsing was carried out with a weakly basic water-water soluble ether mixed liquid, followed by further water rinsing. The surface of the substrate after water rinsing was observed with a microscope, and the carbon hardmask was removed well.

Example 5

A cleaning composition, which is an aqueous solution including 50 mass % of trifluoromethanesulfonic acid and 10 mass % of polyvinylphosphonic acid (mass average molecular weight 200,000), was applied onto a carbon hardmask (film thickness 80 nm) including a polymer including ester bonds, ether bonds and elemental fluorine, formed on a silicon substrate. After application a coating film was heated at 180° C. for 150 seconds. After heating, rinsing was carried out with a weakly basic water-water soluble ether mixed liquid, followed by further water rinsing. The surface of the substrate after water rinsing was observed with a microscope, and the carbon hardmask was removed well.

Example 6

A cleaning composition, which is an aqueous solution including 50 mass % of trifluoromethanesulfonic acid and 5 mass % of cross-linking polyacrylic acid (mass average molecular weight 200,000), was applied onto a carbon hardmask (film thickness 80 nm) including a polymer including ester bonds, ether bonds and elemental fluorine, formed on a silicon substrate. After application a coating film was heated at 180° C. for 150 seconds. After heating, rinsing was carried out with a weakly basic water-water soluble ether mixed liquid, followed by further water rinsing. The surface of the substrate after water rinsing was observed with a microscope, and the carbon hardmask was removed well.

Example 7

A cleaning composition, which is an aqueous solution including 52.5 mass % of pentafluoroethanesulfonic acid and 6.25 mass % of polyacrylic acid (mass average molecular weight 250,000), was applied onto a carbon hardmask (film thickness 80 nm) including a polymer including ester bonds, ether bonds and elemental fluorine, formed on a silicon substrate. After application a coating film was heated at 180° C. for 150 seconds. After heating, rinsing was carried out with a weakly basic water-water soluble ether mixed liquid, followed by further water rinsing. The surface of the substrate after water rinsing was observed with a microscope, and the carbon hardmask was removed well.

Example 8

A cleaning composition, which is an aqueous solution including 55 mass % of nonafluorobutanesulfonic acid and 6.25 mass % of polyacrylic acid (mass average molecular weight 250,000), was applied onto a carbon hardmask (film thickness 80 nm) including a polymer including ester bonds, ether bonds and elemental fluorine, formed on a silicon substrate. After application a coating film was heated at 180° C. for 150 seconds. After heating, rinsing was carried out with a weakly basic water-water soluble ether mixed liquid, followed by further water rinsing. The surface of the substrate after water rinsing was observed with a microscope, and the carbon hardmask was removed well.

Example 9

A cleaning composition, which is an aqueous solution including 17.5 mass % of nitric acid and 12.5 mass % of polyacrylic acid (mass average molecular weight 250,000), was applied onto a carbon hardmask (film thickness 80 nm) including a polymer including ester bonds, ether bonds and elemental fluorine, formed on a silicon substrate. After application a coating film was heated at 180° C. for 300 seconds. After heating, rinsing was carried out with a weakly basic water-water soluble ether mixed liquid, followed by further water rinsing. The surface of the substrate after water rinsing was observed with a microscope, and the carbon hardmask was removed well.

Comparative Example 1

A cleaning composition, which is a DMF solution including 50 mass % of nonafluorobutanesulfonic acid, was applied onto a carbon hardmask film (film thickness 80 nm) including a polymer including ester bonds, ether bonds and elemental fluorine, formed on a silicon substrate. After application a coating film was heated at 180° C. for 120 seconds. After heating, rinsing was carried out with a strongly basic water-DMSO mixed solution, followed by further water rinsing. The surface of the substrate after water rinsing was observed with a microscope, and the carbon hardmask was removed well.

Comparative Example 2

A cleaning composition, which is a DMF solution including 50 mass % of trifluoroacetic acid, was applied onto a carbon hardmask (film thickness 80 nm) including a polymer including ester bonds, ether bonds and elemental fluorine, formed on a silicon substrate. After application a coating film was heated at 180° C. for 120 seconds. After heating, rinsing was carried out with a strongly basic water-DMSO mixed solution, followed by further water rinsing. The surface of the substrate after water rinsing was observed with a microscope, and the carbon hardmask was removed well.

The invention claimed is:

1. A single cleaning composition for cleaning a layer to be treated, wherein said layer to be treated is formed on a substrate, the single cleaning composition comprising:
   a component (A) capable of decomposing the layer to be treated,
   a film-forming polymer (B); and
   a solvent,
   wherein a content of the component (A) in the cleaning composition is 5 to 150% by mass with respect to the total mass of the film-forming polymer (B) and the solvent, and a content of the component (B) is 1 to 30% by mass with respect to the total mass of the film-forming polymer (B) and the solvent,
   the component (A) is an acidic compound (A2), and
   the acidic compound (A2) is at least one selected from the group consisting of trifluoromethanesulfonic acid, pentafluoroethanesulfonic acid, heptafluoropropanesulfonic acid, and nonafluorobutanesulfonic acid.

2. The cleaning composition according to claim 1, wherein the layer to be treated is a hardmask film.

3. The cleaning composition according to claim 2, wherein the hardmask film is a carbon hardmask film.

4. The cleaning composition according to claim 2, wherein the hardmask film comprises a polymer having ether bonds.

5. The cleaning composition according to claim 2, wherein the hardmask film comprises elemental fluorine.

6. The cleaning composition according to claim 1, wherein the film-forming polymer (B) is a film-forming polymer resistant to the component (A).

7. The cleaning composition according to claim 1, wherein the film-forming polymer (B) is at least one selected from the group consisting of a polymer having a constitutional unit derived from (meth)acrylic acid, a polymer having a constitutional unit derived from a vinyl group-containing compound, and a polysaccharide.

8. The cleaning composition according to claim 1, wherein the solvent is at least one selected from the group consisting of water and an organic solvent.

9. A cleaning method, comprising forming a coating film by applying the cleaning composition according to claim 1 onto a layer to be treated, laminated on a substrate.

10. The cleaning method according to claim 9, further comprising heating the coating film.

11. The A cleaning method according to claim 9, further comprising:
- forming a coating film by applying a cleaning composition onto a layer to be treated, laminated on a substrate, the cleaning composition comprising a component (A) capable of decomposing the layer to be treated, a film-forming polymer (B); and a solvent, and
- heating the coating film at a temperature of not lower than a glass transition temperature of the film-forming polymer (B) and not lower than a boiling point of the component (A),
- wherein a content of the component (A) in the cleaning composition is 5 to 150% by mass with respect to the total mass of the film-forming polymer (B) and the solvent, and a content of the component (B) is 1 to 30% by mass with respect to the total mass of the film-forming polymer (B) and the solvent.

12. A method for manufacturing a semiconductor comprising a cleaning method according to claim 9.

13. The cleaning composition according to claim 1, wherein the film-forming polymer (B) is at least one selected from the group consisting of poly(N-vinylacetamide), polyvinylsulfonic acid, polyvinylphosphonic acid, and cross-linking polyacrylic acid.

* * * * *

UNITED STATES PATENT AND TRADEMARK OFFICE
CERTIFICATE OF CORRECTION

PATENT NO. : 11,441,101 B2
APPLICATION NO. : 16/336658
DATED : September 13, 2022
INVENTOR(S) : Isao Hirano et al.

Page 1 of 1

It is certified that error appears in the above-identified patent and that said Letters Patent is hereby corrected as shown below:

On the Title Page

Column 2 (Item (56) Other Publications), Line 1, Delete "Taaiwanese" and insert -- Taiwanese --.

In the Specification

Column 8, Line 15, Delete "$Ar_a$" and insert -- $Ar_3$ --.

Column 4, Line 42 (Approx.), Delete "—OR'," and insert -- —$OR^1$, --.

Column 10, Line 43, Delete "$R_1$" and insert -- $R^1$ --.

Column 15, Line 37, Delete "dimetylstyrene," and insert -- dimethylstyrene, --.

In the Claims

Column 23, Line 6, In Claim 11, delete "The A cleaning method according to claim 9, further" and insert -- A cleaning method, --.

Signed and Sealed this
Twenty-first Day of March, 2023

*Katherine Kelly Vidal*

Katherine Kelly Vidal
*Director of the United States Patent and Trademark Office*